June 9, 1959 AKIO AMAYA 2,890,159
METHOD OF ETCHING A SURFACE OF SEMICONDUCTOR DEVICE
Filed Aug. 14, 1957
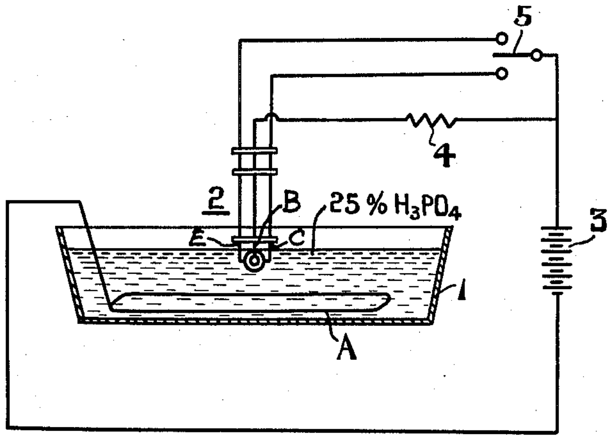
Inventor
Akio Amaya
by Hill, Sherman, Meroni, Gross & Simpson Attys United States Patent Office 2,890,159
Patented June 9, 1959

2,890,159

METHOD OF ETCHING A SURFACE OF SEMICONDUCTOR DEVICE

Akio Amaya, Tokyo, Japan, assignor to Sony Kabushikikaisha, Tokyo, Japan, a corporation of Japan Application August 14, 1957, Serial No. 678,131
Claims priority, application Japan August 31, 1956
1 Claim. (Cl. 204—143)

This invention relates to a method of etching a surface of a semiconductor device, and more particularly to a method for etching surfaces of N–P–N alloy junction germanium transistors.

For etching surfaces of P–N–P alloy junction germanium transistors, which are now most widely produced, an electrolytic dipping process with concentrated caustic alkali solutions such as 30% of potassium hydroxide or 20% of sodium hydroxide solution has been widely used with success.

For N–P–N alloy junction transistors, however, the above process causes the following defects:

That is, strong caustic alkalies seem to be easily adsorbed on germanium surfaces and are difficult to be completely removed by simple rinsing, and this is especially the case for alkalies which are taken in etch pits on germanium surface. Moreover, these alkalies are so hygroscopic that it is also very difficult to completely dry them by an ordinary simple drying process, such as a method of putting them under infra-red radiation or of blowing dry air or nitrogen against them.

Therefore alkalies are always accompanied by a very small amount of water.

Under operating conditions of a N–P–N alloy junction transistor, a potential greater than several to ten volts is applied across the collector and the base thereof, the positive potential being to the former while the negative potential to the latter and a srong electric field is established therebetween. Under such conditions electrolysis will proceed, with anode of the collector dot and cathode of the base, and the residual alkali which is positioned at or neighborhood of the junction acts as an electrolytic solution since the residual alkali contains water in spite of small amount thereof as above described. Lead antimony or lead arsenic alloy of the collector will be attacked and lead dioxide will be formed and grow towards the base region and causes short circuit between the collector and the base because of the fact that lead dioxide has larger specific volume than that of lead and conducts electricity.

At the same time some dissolved lead will deposit as metal lead on the base region and it will grow towards the collector to cause also short circuiting.

Experiments show that sudden short-circuiting conditions are occurred between the collectors and the bases in 9 units of N–P–N alloy junction transistors out of 50 units which are processed by electrolytic etching in a strong alkali solution and subjected to the operating test at 25 volts reverse bias with 1 ma. of emitter current for 50 hours. That is, the collector cutoff currents of these units which are deteriorated are respectively larger than 2 ma. at 10 volts.

It is an object of this invention to provide a new and novel method for etching surfaces of a germanium semiconductor device, which is not accompanied by the above mentioned disadvantages.

It is another object of this invention to provide a method for etching a surface of a N–P–N alloy junction germanium transistor which is not deteriorated by an electrolytic action.

In accordance with this invention a phosphoric acid solution is used as an etchant. Because it is observed that the solubility product of lead phosphate $Pb_3(PO_4)_2$ is very small, say in the order of $2.95\times10^{-44}$ at 25° C., and that the sudden deterioration caused by the electrolysis between the collector and the base as mentioned above will not occur, even if some amount of phosphoric acid remains at or in the neighborhood of the junction.

It is also recognized that germanium is etched fairly and easily by the phosphoric acid, while lead alloy of the collector or emitter and nickel and Kovar as a lead wire are not so easily etched thereby, although color change is observed on the surfaces of the materials. This fact is also one of the advantages of this etchant.

Other objects, features and advantages of this invention will be more fully apparent from the following detailed description given with the accompanying drawing, in which:

A single figure is a schematic diagram illustrating one example of the method according to this invention.

The electrolytic conditions of this example is as follows:

Etchant: 25% phosphoric acid water solution.
Cathode: platinum wire.
Etching current: 500 ma. to 800 ma.
Time: 12 seconds for both emitter and collector.
Temperature: 15° C. to 30° C.

Referring to the drawing, a glass vessel 1 contains the above etchant in which a germanium transistor is immersed in reverse state. The base B is connected to the positive electrode of a D.C. source 3 through a resistor 4 having the resistance of about 200 ohms Ω so as to be subjected to the bias current of 20 to 100 ma. while the emitter E and collector C are connected interchangeably to the same side of the source by a change-over switch 5, the negative electrode of the source 3 being connected to a looped wire A immersed in the etchant.

Units treated by the illustrated method are not deteriorated suddenly under the same test conditions as in the units treated by alkali solution.

It will be understood that modifications and variations may be effected without departing from the scope of the novel conceptions of this invention.

What is claimed is:

A method of etching surfaces of a N–P–N germanium alloy junction transistor having an emitter and collector of lead alloy, which comprises locating said transistor in an etchant comprising substantially 25% phosphoric acid in water solution, connecting the base of said transistor through a resistor to the positive side of a D.C. source and the negative side of said source to a looped platinum wire completely immersed in said etchant, and connecting the emitter and collector of the transistor alternately by switch means to the positive side of the D.C. source while passing current therethrough of between about 500 and 800 ma. for approximately twelve seconds for both the emitter and collector.

References Cited in the file of this patent

UNITED STATES PATENTS

| | | |
|---|---|---|
| 2,783,197 | Herbert | Feb. 26, 1957 |
| 2,802,159 | Stump | Aug. 6, 1957 |

FOREIGN PATENTS

| | | |
|---|---|---|
| 869,718 | Germany | Mar. 5, 1953 |